(12) United States Patent
Baker et al.

(10) Patent No.: US 10,155,248 B2
(45) Date of Patent: Dec. 18, 2018

(54) METAL DEWETTING METHODS AND ARTICLES PRODUCED THEREBY

(71) Applicants: CORNING INCORPORATED, Corning, NY (US); ICFO (THE INSTITUTE OF PHOTONIC SCIENCES), Barcelona (ES); ICREA (INSTITUTE CATALANA DE RECERCA I ESTUDIS AVANCATS), Barcelona (ES)

(72) Inventors: David Eugene Baker, Bath, NY (US); Carme Gomez Carbonell, Barcelona (ES); David Francis Dawson-Elli, Elmira, NY (US); Prantik Mazumder, Ithaca, NY (US); Valerio Pruneri, Castelldefels (ES); Lili Tian, Laurel, MD (US)

(73) Assignee: CORNING INCORPORATED, Corning, NY (US)

( * ) Notice: Subject to any disclaimer, the term of this patent is extended or adjusted under 35 U.S.C. 154(b) by 299 days.

(21) Appl. No.: 15/044,330

(22) Filed: Feb. 16, 2016

(65) Prior Publication Data
US 2016/0158798 A1 Jun. 9, 2016

Related U.S. Application Data

(62) Division of application No. 13/687,208, filed on Nov. 28, 2012, now Pat. No. 9,296,183.
(Continued)

(51) Int. Cl.
*B05D 3/00* (2006.01)
*B32B 33/00* (2006.01)
(Continued)

(52) U.S. Cl.
CPC ............ *B05D 3/007* (2013.01); *B05D 3/0254* (2013.01); *B32B 33/00* (2013.01); *C03C 17/06* (2013.01);
(Continued)

(58) Field of Classification Search
None
See application file for complete search history.

(56) References Cited

U.S. PATENT DOCUMENTS 5,968,857 A * 10/1999 Pinckney ............... C03C 17/22
136/258
7,378,310 B1 * 5/2008 Wang ..................... B82Y 10/00
257/E29.013
(Continued)

FOREIGN PATENT DOCUMENTS

WO 2008036074 A3 3/2008
WO 2009150169 A1 12/2009
(Continued)

OTHER PUBLICATIONS

G. Reiter, Phys. Rev. Lett. 68, 75 (1992), Dewetting of Thin Polymer Films.
(Continued)

*Primary Examiner* — Michael P. Rodriguez
(74) *Attorney, Agent, or Firm* — Kevin M. Johnson

(57) ABSTRACT

Described herein are improved dewetting methods and improved patterned articles produced using such methods. The improved methods and articles generally implement continuous ultra-thin metal-containing films or film stacks as the materials to be dewetted. For example, a method can involve the steps of providing a substrate that has a continuous ultra-thin metal-containing film or film stack disposed on a surface thereof, and dewetting at least a portion of the continuous ultra-thin metal-containing film or film
(Continued)

stack to produce a plurality of discrete metal-containing dewetted islands on the surface of the substrate.

20 Claims, 11 Drawing Sheets

Related U.S. Application Data

(60) Provisional application No. 61/564,903, filed on Nov. 30, 2011.

(51) Int. Cl.
| | | |
|---|---|---|
| *B05D 3/02* | (2006.01) | |
| *C23C 14/18* | (2006.01) | |
| *C23C 14/58* | (2006.01) | |
| *C03C 17/06* | (2006.01) | |

(52) U.S. Cl.
CPC ........ *C23C 14/185* (2013.01); *C23C 14/5806* (2013.01); *Y10T 428/24355* (2015.01)

(56) References Cited

U.S. PATENT DOCUMENTS

| | | | |
|---|---|---|---|
| 9,023,457 B2* | 5/2015 | Carrilero | C23F 1/02 216/41 |
| 2004/0067339 A1 | 4/2004 | Gandon et al. | |
| 2008/0206550 A1 | 8/2008 | Borlner | |
| 2009/0014416 A1 | 1/2009 | Gandon et al. | |
| 2009/0025791 A1* | 1/2009 | Matsui | H01L 31/022466 136/261 |
| 2009/0050901 A1* | 2/2009 | Gadkaree | H01L 21/2007 257/77 |
| 2009/0197048 A1 | 8/2009 | Amin et al. | |
| 2010/0028604 A1 | 2/2010 | Bhushan et al. | |
| 2010/0098909 A1 | 4/2010 | Reyssat et al. | |
| 2010/0209673 A1 | 8/2010 | Viasnoff et al. | |
| 2010/0285275 A1 | 11/2010 | Baca et al. | |
| 2011/0114226 A1 | 5/2011 | Pruneri et al. | |
| 2012/0260983 A1 | 10/2012 | Pruneri et al. | |
| 2015/0174625 A1* | 6/2015 | Hart | B08B 17/065 428/141 |

FOREIGN PATENT DOCUMENTS

| | | |
|---|---|---|
| WO | 2010017503 A1 | 2/2010 |
| WO | 2010022107 A2 | 2/2010 |

OTHER PUBLICATIONS

R. Yerushalnni-Rozen, J. Klein, and L. J. Fetters, Science, 263, 793 (1994), Supression of Rupture in Thin, Nonwetting Liquid Films.
J. Bischof et al., Phys. Rev. Lett. 77, 1536 (1996), Dewetting Modes of Thin Metallic Films: Nucleation of Holes and Spinodal Dewetting.
M. Khenner, Phys. Rev. B, 77, 165414(2008), Dewetting of an ultrathin solid film on a lattic-matched or amorphous substate.
O. Pierre-Louis, A. Chame, and Y. Saito, Phys. Rev. Lett., 99, 136101(2007), Dewetting of a Solid Monolayer.
C. Schrank, C. Eisenmenger-Sittner, E. Neubauer, H. Bangert, A. Bergauer, Thin Solid Films, 459, 276(2004), Solid State De-wetting Observed for Vapor Deposited Copper Films on Carbon Substrates.
Jie Lian, Lumin Wang, Xiangcheng Sun, Qingkai Yu, and Rodney C. Ewing, Nano Letters, 6, 1047(2006), Patterning Metallic Nanostructures by Ion-Beam-Induced Dewetting and Rayleigh Instability.
Ji-Myon Lee, Seong-Ju Park, Proceedings of SPIE—The International Society for Optical Engineering, v 5931, p. 1-7, 2005, Nanoengineering: Fabrication, Properties, Optics, and Devices II, Fabrication of nanostructures by dry etching using dewetted Pt islands as etch-masks.
Amare Benor, Arne Hoppe, Veit Wagner, Dietmar Knipp, Thin Solid Films 515 (2007) 7679-7682, Microcontact printing and selective surface dewetting for large area electronic applications.

* cited by examiner

METAL DEWETTING METHODS AND ARTICLES PRODUCED THEREBY

CROSS-REFERENCE TO RELATED APPLICATIONS

This application is a divisional application and claims the benefit of priority under 35 U.S.C. § 120 of U.S. patent application Ser. No. 13/687,208 filed on Nov. 28, 2012, now U.S. Pat. No. 9,296,183, which claims the benefit of priority under 35 U.S.C. § 119 of U.S. Provisional Patent Application Ser. No. 61/564,903 filed on Nov. 30, 2011, the contents of which are relied upon and incorporated herein by reference in their entirety as if fully set forth below.

TECHNICAL FIELD

The present disclosure relates generally to patterned surfaces. More particularly, the various embodiments described herein relate to methods of producing surfaces with nanostructured metal-containing islands disposed thereon, as well as to the articles produced by such methods.

BACKGROUND

The trend in many industries to make devices smaller has led to an explosion in the development of techniques that can be used to manufacture micrometer- and, more particularly, nanometer-scale features on surfaces. One such technique is based on the concept of dewetting, which generally refers to processes where solid or liquid films located on a given surface break down into discrete droplets or islands on the surface in order to reduce the free energy of the system.

Regardless of whether the initial film is a solid or liquid, it can be thermodynamically metastable at low thicknesses. This is, at least in part, due to the fact that the surface energy of the film is higher than that of the interface between the film and the substrate, and higher also than that of the substrate itself. When energy (e.g., thermal energy, electromagnetic energy, plasma energy, and the like) is introduced to such a film, the activation barrier against atomic diffusion can be overcome. Under such conditions, the atomic diffusion causes the film to dewet (i.e., transform into discrete islands on the surface of the substrate).

Prolonged exposure to the dewetting energy source can lead to decreased island sizes that can be desirable for certain applications. Unfortunately, sustained exposure to the dewetting energy source can also adversely affect the underlying substrate or other device components. By way of illustration, to dewet a metal film from a semiconductor substrate, high temperatures are often used. These high temperatures can damage the semiconductor substrate itself and/or any device components that are disposed thereon and/or in the immediate vicinity. Such damage can include melting, decomposition, oxidation, and the like.

Another drawback associated with existing dewetting methods is the difficulty obtaining continuous starting films at low thicknesses needed in order to achieve small (i.e., micrometer- or nanometer-scale) island sizes. For example, discontinuous starting films can result in inefficient dewetting, because the film can partially wet previously uncovered/unwetted areas of the substrate while also dewetting other (covered/wetted) areas. To combat this, thicker films are often used. Unfortunately, thicker films, while providing more efficient dewetting, result in larger islands and/or larger surface coverage areas. For applications where smaller island sizes are needed, this can be undesirable.

There accordingly remains a need for technologies that provide improved dewetting of surfaces with the ability to achieve smaller feature sizes. It would be beneficial if such technologies could be implemented without adversely affecting the substrates that are dewetted. It is to the provision of such technologies that the present disclosure is directed.

BRIEF SUMMARY

Described herein are improved dewetting methods that enable smaller feature sizes to be achieved on surfaces. In addition, improved patterned articles having nanostructured features are provided.

One type of patterned article can include a substrate, a substantially continuous ultra-thin metal-containing film or film stack disposed on a surface of the substrate, and a plurality of discrete dewetted (i.e., not individually positioned, not sprayed, or otherwise individually or groupwise deposited) metal-containing islands disposed on a surface of the continuous ultra-thin metal-containing film or film stack. The plurality of discrete metal-containing dewetted islands in this type of patterned article can have an average height of about 5 nanometers (nm) to about 300 nm, an average longest lateral cross-sectional dimension of about 10 nm to about 1000 nm, and/or can be randomly oriented on the surface of the continuous ultra-thin metal-containing film or film stack so as to cover less than or equal to about 0.5 of an area fraction of the portion of the surface of the continuous ultra-thin metal-containing film or film stack.

In certain implementations, it is possible for the continuous ultra-thin metal-containing film or film stack to have an average thickness of less than or equal to about 5 nm.

In some implementations of this type of patterned article, the substrate can include a silicate glass, borosilicate glass, aluminosilicate glass, or boroaluminosilicate glass, and optionally comprises an alkali or alkaline earth modifier. In other situations, the substrate can be a glass-ceramic comprising a glassy phase and a ceramic phase, wherein the ceramic phase comprises β-spodumene, β-quartz, nepheline, kalsilite, or carnegieite. In still other situations, the substrate can be a ceramic material, or a polymer. Regardless of the type of substrate chosen, in certain cases, the substrate can have an average thickness of about 0.02 millimeters (mm) to about 2 mm.

The plurality of discrete dewetted metal-containing islands in this type of patterned article can include a metal in its elemental form or a metal that is a constituent of an alloy. It is also possible for a portion of the plurality of discrete metal-containing dewetted islands to comprise a passivation layer. In some implementations, the average height of the plurality of discrete metal-containing dewetted islands can be about 20 nm to about 100 nm, the average longest lateral cross-sectional dimension of the plurality of discrete metal-containing dewetted islands can be about 30 nm to about 200 nm, and/or the area fraction covered by the plurality of discrete metal-containing dewetted islands can be less than or equal to about 0.25 of the surface of the continuous ultra-thin metal-containing film or film stack.

This type of patterned article can form a portion of an anti-reflection coating, a metal mask, a localized surface plasmon resonance structure, a catalyst, a catalyst support, an anti-virus coating, or an antibacterial coating, just to name a few applications or uses.

Another type of patterned article includes a strengthened alkali aluminosilicate glass substrate, a continuous ultra-thin metal-containing film or film stack disposed on a surface of the strengthened alkali aluminosilicate glass substrate, wherein the continuous ultra-thin metal-containing film or film stack has an average thickness of less than or equal to about 5 nanometers, and a plurality of discrete dewetted metal-containing islands disposed on a surface of the continuous ultra-thin metal-containing film or film stack. The plurality of discrete metal-containing dewetted islands in this type of patterned article can have an average height of about less than or equal to about 130 nm, an average longest lateral cross-sectional dimension of about 50 nm to about 200 nm, and are randomly oriented on the surface of the continuous ultra-thin metal-containing film or film stack so as to cover less than or equal to about 0.1 of an area fraction of the surface of the continuous ultra-thin metal-containing film or film stack.

The plurality of discrete dewetted metal-containing islands in this type of patterned article can include a metal in its elemental form or a metal that is a constituent of an alloy. It is also possible for a portion of the plurality of discrete metal-containing dewetted islands to comprise a passivation layer.

One type of method of forming a patterned article can include the steps of providing a substrate comprising a continuous ultra-thin metal-containing film stack disposed on a surface of the substrate, wherein the continuous ultra-thin metal-containing film stack comprises at least a first layer disposed on the surface of the substrate and a second layer disposed on the first layer, and dewetting at least a portion of the second layer of the continuous ultra-thin metal-containing film stack to produce a plurality of discrete metal-containing dewetted islands on a surface of the first layer of the continuous ultra-thin metal-containing film stack. The first layer and/or second layer of the continuous ultra-thin metal-containing film stack can independently be a single layer or a multi-layer.

In certain implementations of this type of method, the continuous ultra-thin metal-containing film stack can have an average thickness of less than or equal to about 10 nm. In addition, or in the alternative, the continuous ultra-thin metal-containing film stack can have no openings or void spaces in an area defined by its perimeter.

The continuous ultra-thin metal-containing film stack of this type of method can include a metal in its elemental form or a metal that is a constituent of an alloy. It is also possible for the continuous ultra-thin metal-containing film stack to include a passivation layer.

In certain situations, the dewetting step involves a thermal treatment for a time and at a temperature sufficient to produce the plurality of discrete metal-containing dewetted islands on the surface of the first layer of the continuous ultra-thin metal-containing film stack such that the plurality of discrete metal-containing dewetted islands have an average height of about 5 nm to about 300 nm, an average longest lateral cross-sectional dimension of about 10 nm to about 1000 nm, and are randomly oriented on the surface of the first layer of the continuous ultra-thin metal-containing film stack so as to cover less than or equal to about 0.5 of an area fraction of the portion of the surface of the first layer of the continuous ultra-thin metal-containing film stack. For example, the thermal treatment can be carried out at a temperature of less than or equal to about 800 degrees Celsius (° C.) and/or for a time of less than or equal to about 1 hour.

It is to be understood that both the foregoing brief summary and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

Figure 1:
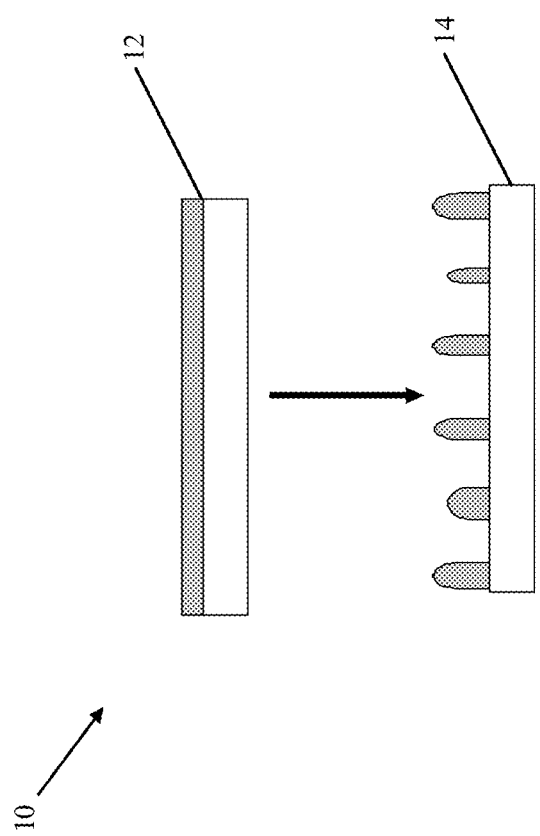
FIG. 1 is a schematic illustration of a method for making patterned articles having nanostructured features.

These and other aspects, advantages, and salient features will become apparent from the following detailed description, the accompanying drawings, and the appended claims.

DETAILED DESCRIPTION

Referring now to the figures, wherein like reference numerals represent like parts throughout the several views, exemplary embodiments will be described in detail. Throughout this description, various components may be identified having specific values or parameters. These items, however, are provided as being exemplary of the present disclosure. Indeed, the exemplary embodiments do not limit the various aspects and concepts, as many comparable parameters, sizes, ranges, and/or values may be implemented. Similarly, the terms "first," "second," "primary," "secondary," "top," "bottom," "distal," "proximal," and the like, do not denote any order, quantity, or importance, but rather are used to distinguish one element from another. Further, the terms "a," "an," and "the" do not denote a limitation of quantity, but rather denote the presence of "at least one" of the referenced item.

Provided herein are improved dewetting methods that enable smaller dewetted feature sizes to be achieved on surfaces. In addition, improved articles having nanostructured features are provided. The improved methods and articles generally make use of continuous ultra-thin metal-containing films or film stacks (collectively referred to herein for convenience as "CUTMFs") as the materials to be dewetted. That is, the CUTMFs are disposed on the substrates, and are subsequently dewetted to produce the desired features on the substrates. As will be described in more detail below, by changing the dewetting process parameters, including, for example, the time, temperature, and atmosphere of the dewetting step, the nanostructured pattern can be tailored. For example, the lateral dimensions of the nanostructured features, the height of the nanostructured features, and/or the percentage of the overall area of the surface of the substrate covered by the nanostructured features can be controlled.

For the avoidance of doubt, the term "ultra-thin" is used herein to refer to films or film stacks that have an average thickness of less than or equal to about 30 nm. Also, as used herein, the term "continuous" refers to films or film stacks whose perimeter defines an area or region that comprises less than 1 percent (%) of openings or void spaces.

The various methods of making the patterned articles are schematically illustrated in FIG. 1. These methods, generically designated by numeral 10, include the steps of providing a substrate comprising a CUTMF disposed on a surface thereof 12, and dewetting the CUTMF to produce a plurality of discrete metal-containing dewetted islands on the surface of the substrate 14.

Provision of the CUTMF-coated substrate can first involve selection of an appropriate set of materials for use as the substrate and the CUTMF. These choices will be made based on the particular application desired for the final patterned article. In general, however, a variety of substrates and CUTMFs can be used, with the proviso that they are not adversely affected by each other and/or the conditions to which they will be exposed. That is, the CUTMF material should be compatible with the substrate, such that the substrate does not deform, undergo an undesirable chemical reaction, melt, sublime, decompose, or the like, when the CUTMF is formed or disposed on the surface of the substrate. Similarly, the substrate and CUTMF materials should be chosen such that they do not undergo an undesirable chemical reaction, melt, sublime, decompose, or the like (other than the physical process of dewetting), during the dewetting step.

With these considerations in mind, the substrate can be a glass material, a glass-ceramic material, a ceramic material, a polymeric material, or the like. By way of illustration, with respect to glasses, the material chosen can be any of a wide range of silicate, borosilicate, aluminosilicate, or boroaluminosilicate glass compositions, which optionally can comprise one or more alkali and/or alkaline earth modifiers. One such glass composition includes the following constituents: 58-72 mole percent (mol %) $SiO_2$; 9-17 mol % $Al_2O_3$; 2-12 mol % $B_2O_3$; 8-16 mol % $Na_2O$; and 0-4 mol % $K_2O$, wherein the ratio $$\frac{Al_2O_3(\text{mol \%}) + B_2O_2(\text{mol \%})}{\sum \text{modifiers (mol \%)}} > 1,$$

where the modifiers comprise alkali metal oxides. Another glass composition includes the following constituents: 61-75 mol % $SiO_2$; 7-15 mol % $Al_2O_3$; 0-12 mol % $B_2O_3$; 9-21 mol % $Na_2O$; 0-4 mol % $K_2O$; 0-7 mol % MgO; and 0-3 mol % CaO. Yet another illustrative glass composition includes the following constituents: 60-70 mol % $SiO_2$; 6-14 mol % $Al_2O_3$; 0-15 mol % $B_2O_3$; 0-15 mol % $Li_2O$; 0-20 mol % $Na_2O$; 0-10 mol % $K_2O$; 0-8 mol % MgO; 0-10 mol % CaO; 0-5 mol % $ZrO_2$; 0-1 mol % $SnO_2$; 0-1 mol % $CeO_2$; less than 50 parts per million (ppm) $As_2O_3$; and less than 50 ppm $Sb_2O_3$; wherein 12 mol %≤$Li_2O+Na_2O+K_2O$≤20 mol %, and 0 mol %≤MgO+CaO≤10 mol %. Still another illustrative glass composition includes the following constituents: 55-75 mol % $SiO_2$, 8-15 mol % $Al_2O_3$, 10-20 mol % $B_2O_3$; 0-8% MgO, 0-8 mol % CaO, 0-8 mol % SrO, and 0-8 mol % BaO.

Similarly, with respect to glass-ceramics, the material chosen can be any of a wide range of materials having both a glassy phase and a ceramic phase. Illustrative glass-ceramics include those materials where the glass phase is formed from a silicate, borosilicate, aluminosilicate, or boroaluminosilicate, and the ceramic phase is formed from β-spodumene, β-quartz, nepheline, kalsilite, or carnegieite.

If the substrate is formed from a ceramic material, it can be any of a variety of oxides, carbides, nitrides, oxycarbides, carbonitrides, or the like, whether in polycrystalline or single crystal form. One such ceramic is polycrystalline $Al_2O_3$. Another illustrative ceramic is polycrystalline SiC. Yet another illustrative ceramic material is single-crystal GaAs (e.g., as used in the fabrication of certain semiconductor devices).

If the substrate is formed from a polymer material, it can be chosen from a variety of thermosetting or thermoplastic materials, including those that are polyamides, polyesters, polyimides, polysulfones, polycarbonates, polyurethanes, polyurethane-ureas, polyolefins, phenols, epoxies, polyacrylates, polymethylacrylates, polystyrenes, polyhydroxy acids, polyanhydrides, polyorthoesters, polyphosphazenes, polyphosphates, copolymers thereof, blends thereof, or the like.

Regardless of the material chosen therefor, the substrate can adopt a variety of physical forms. That is, from a cross-sectional perspective, the substrate can be flat or planar, or it can be curved and/or sharply-bent. Similarly, it can be a single unitary object, or a multi-layered structure or laminate.

In certain situations, the substrate can be subjected to an optional treatment in preparation for application of the CUTMF. Examples of such treatments include physical or chemical cleaning, physical or chemical strengthening (e.g., by thermal tempering, chemical ion-exchange, or like processes in the case of a glass), physical or chemical etching, physical or chemical polishing, annealing, sintering, shaping, and/or the like. Such processes are known to those skilled in the art to which this disclosure pertains.

Once the substrate has been selected and/or prepared, the CUTMF material can be selected and disposed on the substrate. In addition to the above considerations in mind, the materials used to form the CUTMF must be chosen such that at least a portion of the final CUTMF (i.e., before dewetting) comprises a metal that is in its elemental form or that is a constituent of an alloy with one or more other metals. One such CUTMF is a film that consists of an elemental metal or an alloy. Another illustrative CUTMF is a film that includes an elemental metal or an alloy along with a passivation layer (e.g., an oxide, halide, chalcogenide, or the like, of a metal, which can be the same metal as the elemental metal, one of the constituents of the alloy, or an entirely different metal) on an upper/outer surface of the CUTMF. Yet another illustrative CUTMF is a film stack that includes two or more layers, wherein each layer independently consists of an elemental metal or an alloy. Still another illustrative CUTMF is a film stack that includes two or more layers, wherein each layer independently includes an elemental metal or an alloy, and wherein each layer can also include a passivation layer. Examples of such metals include Cu, Ni, Ti, Ag, Cr, Al, Au, or the like.

Depending on the materials chosen, the CUTMF can be formed using a variety of techniques. In general, the CUTMF is not a free-standing film that can be applied (e.g., via an adhesive or other fastening means) to the surface of the substrate, but is, in fact, physically formed on the surface of the substrate. By way of example, the CUTMF can be fabricated using any of the variants of chemical vapor deposition (CVD) (e.g., plasma-enhanced CVD, aerosol-assisted CVD, metal organic CVD, and the like), any of the variants of physical vapor deposition (PVD) (e.g., ion-assisted PVD, pulsed laser deposition, cathodic arc deposition, sputtering, and the like), atomic layer deposition, spray coating, spin-coating, dip-coating, inkjetting, sol-gel processing, or the like. Such processes are known to those skilled in the art to which this disclosure pertains.

As stated above, the CUTMF must be at least "continuous" (i.e., it must comprise less than 1% of openings or void spaces in the area defined by its perimeter) and "ultra-thin" (i.e., it must have an average thickness of less than or equal to about 30 nm). In certain implementations, however, the CUTMF can have no openings or void spaces in the area defined by its perimeter. Similarly, in certain implementations, the CUTMF can have an average thickness of less than or equal to about 10 nm.

In some cases, the CUTMF-coated substrate can be subjected to an optional treatment in preparation for the dewetting step. Examples of such treatments include physical or chemical cleaning, physical or chemical strengthening, physical or chemical etching, physical or chemical polishing, annealing, sintering, shaping, and/or the like. Such processes are known to those skilled in the art to which this disclosure pertains.

Once the CUTMF has been disposed on at least a portion of the substrate, the CUTMF-coated substrate can be dewetted. The dewetting step generally involves subjecting the CUTMF-coated substrate to a thermal treatment that is sufficient to overcome the activation barrier against atomic diffusion in the CUTMF, such that the CUTMF breaks down into a plurality of discrete metal-containing islands (just as with the CUTMF, the metal-containing islands must also comprise a metal that is in its elemental form or that is a constituent of an alloy with one or more other metals) on the surface of the substrate in order to reduce the free energy of the system.

In situations where a film stack is used as the CUTMF, instead of the entire CUTMF dewetting, the dewetting step can alternatively result in an outer layer (i.e., a layer of the CUTMF stack not most adjacent to the substrate surface) dewetting, while leaving an inner layer (i.e., a layer of the stack more adjacent to the substrate surface than the outer layer) behind as a continuous layer on the surface of the substrate. For example, if the CUTMF includes two different layers, and the surface energy of the outer layer of the CUTMF stack is higher than that of 1) the interface between the outer layer and the inner layer of the stack, 2) the inner layer of the stack itself, 3) the interface between the inner layer of the stack and the substrate, and 4) the substrate itself, then the outer layer will dewet from the inner layer during the dewetting step. This will result in the metal-containing islands, which were formed from the outer layer of the CUTMF stack, to be formed on the inner layer of the CUTMF stack. The remaining inner layer in such situations will have an average thickness of less than or equal to about 5 nm. In certain cases, the remaining inner layer can have an average thickness of less than or equal to about 3 nm.

In some of these implementations, additional dewetting can result in the at least a portion of the inner layer of the CUTMF stack dewetting, too. Thus, at least some of the metal-containing islands can comprise one region formed from the material of the outer layer of the CUTMF stack and another region formed from the material of the inner layer of the CUTMF stack. It is also possible for at least some of the metal-containing islands to comprise at least a region formed from an alloy or combination of the materials of the inner and outer layers of the CUTMF stack.

Advantageously, the dewetting step described herein can make use of significantly lower temperatures and/or durations than existing dewetting technologies, while simultaneously producing smaller islands on the surface of the substrate. Specifically, the thermal treatment generally involves temperatures of less than or equal to about 700° C. In certain implementations, the thermal treatment involves temperatures of less than or equal to about 600° C. In other implementations, such as many of those where a film stack is used, the thermal treatment involves temperatures of less than or equal to about 200° C. With respect to timing, the thermal treatment generally takes less than or equal to about 1 hour. In certain implementations, the thermal treatment can be completed in less than or equal to about 10 minutes. In other implementations, the thermal treatment can be completed in less than or equal to about 30 seconds.

The dewetting step can be carried out in a variety of conditions. For example, in certain implementations, the dewetting step will be performed while the sample is maintained under reduced pressure or vacuum conditions. In other implementations, the dewetting step can be performed under ambient pressure conditions. In addition to pressure, the atmosphere in which the CUTMF-coated substrate is maintained during the thermal treatment can be varied. That is, in certain implementations, a gas (other than air) can be flowed over the CUTMF-coated substrate during the thermal treatment. Such gases can include $O_2$, $N_2$, Ar, or the like.

Those skilled in the art to which this disclosure pertains will recognize that a variety of temperatures, durations, pressures, and atmospheric conditions can be implemented during the thermal treatment of the dewetting step. By way of example, one specific dewetting step can involve heating a CUTMF-coated substrate in a furnace, which is held at about 1 atmosphere of pressure (i.e., ambient pressure) while an inert gas (e.g., $N_2$ or Ar) flows throughout the furnace, at a temperature of less than or equal to about 600° C. for about 30 seconds to about 2 minutes. In contrast, another specific dewetting step can involve heating a CUTMF-coated substrate in a vacuum furnace at a temperature of about 180° C. to about 500° C. for about 1 minute to about 1 hour.

The final patterned article, obtained after the dewetting step has been carried out on the CUTMF-coated substrate, can be used in a variety of applications where patterned or textured surfaces are desirable. These applications encompass anti-reflection coatings, metal masks (e.g., for photolithography, chemical etching processes that can produce a textured surface, or the like), localized surface plasmon resonance structures (e.g., for applications such as chemical and bio-sensing, lasing, light trapping, light harvesting in photovoltaics, or the like), catalysis (e.g., as a catalyst itself, or as a catalyst support), and anti-virus or antibacterial coatings, just to name a few.

Given the breadth of potential uses for the patterned articles described herein, it should be understood that the specific features or properties of a particular patterned article will depend on the ultimate application therefor or use thereof. The following description, however, will provide some general considerations.

There is no particular limitation on the average thickness of the substrate contemplated herein. In many applications, however, the average thickness will be less than or equal to about 15 mm. If the patterned article is to be used in applications where it may be desirable to optimize thickness for weight, cost, and/or strength characteristics (e.g., in electronic devices as coatings, sensor components, or the like), then even thinner substrates (e.g., less than or equal to about 5 mm) can be used. By way of example, if the patterned article is intended to function as an anti-reflection coating for an electronic device or as a localized surface plasmon resonance structure in a sensor, then the substrate can exhibit an average thickness of about 0.02 mm to about 2.0 mm.

In contrast to the substrate, where thickness is not limited, the dimensional parameters of the dewetted metal-containing islands will be limited to the nanoscale given the average thicknesses of the CUTMFs. Thus, the average height of the dewetted metal-containing islands should be about 5 nm to about 300 nm. In certain situations, however, the average height of the dewetted metal-containing islands can be about 20 nm to about 100 nm. In addition, the average longest lateral cross-sectional dimension of the dewetted metal-containing islands should be about 10 nm to about 1000 nm. As used herein, the term "longest lateral cross-sectional dimension" refers to a particular dimension of an island that is parallel to the surface of the substrate. Thus, to clarify, when an island is circular, the longest lateral cross-sectional dimension is its diameter; when an island is oval-shaped, the longest lateral cross-sectional dimension is the longest diameter of the oval; and when an island is irregularly-shaped, the longest lateral cross-sectional dimension is the line between the two farthest opposing points on the longest perimeter of the island. In certain situations, the average longest lateral cross-sectional dimension of the dewetted metal-containing islands can be about 30 nm to about 200 nm.

Further, the area fraction of the surface of the substrate or an inner layer of a CUTMF film stack that is covered by the dewetted metal-containing islands should be less than or equal to about 0.5. That is, less than or equal to about 50% of the total area of the surface of the substrate that was initially covered by the CUTMF will be covered by the dewetted metal-containing islands. In certain situations, the area fraction of the surface of the substrate or an inner layer of a CUTMF film stack that is covered by the dewetted metal-containing islands can be less than or equal to about 0.25.

To achieve smaller average thicknesses, average longest lateral cross-sectional dimensions, and/or area fractions of the dewetted metal-containing islands, the average thickness of the CUTMFs can be decreased and/or the extent of dewetting can be increased.

In a specific embodiment that might be particularly advantageous for applications such as coatings for electronic devices or localized surface plasmon resonance structures for sensing, light trapping, or light harvesting, a patterned article is formed using a chemically strengthened (ion exchanged) alkali aluminosilicate flat glass sheet as the substrate. The CUTMF comprises a single layer of a metal such as Ag, Ni, or Cu, having an average thickness between about 6 nm and about 15 nm. The CUTMF is coated directly on one surface of the chemically strengthened (ion exchanged) alkali aluminosilicate flat glass sheet using magnetron sputtering. The dewetting step is carried out in a rapid thermal annealing furnace at ambient pressure, while $N_2$ or Ar flows over the CUTMF-coated substrate to prevent oxidation of the CUTMF, at a temperature of about 750° C. for about 50 seconds to about 2 minutes.

This process can produce a patterned article with dewetted metal-containing islands having an average height of less than about 130 nm, and an average longest lateral cross-sectional dimension of about 50 nm to about 200 nm. The area fraction of the surface of the chemically strengthened (ion exchanged) alkali aluminosilicate glass substrate that is covered by the dewetted metal-containing islands can be less than or equal to about 0.10.

In another specific embodiment, a patterned article is formed using a chemically strengthened (ion exchanged) alkali aluminosilicate flat glass sheet as the substrate. The CUTMF comprises a first layer of a metal, having an average thickness less than or equal to about 2 nm, and a second layer of another metal, having an average thickness less than or equal to about 6 nm. The CUTMF stack is coated directly on one surface of the chemically strengthened (ion exchanged) alkali aluminosilicate flat glass sheet using magnetron sputtering. The dewetting step is carried out in vacuum furnace, purged with $N_2$, at a temperature of about 180° C. for about 5 minutes to about 20 minutes.

This process can produce a patterned article with dewetted metal-containing islands of the second metal disposed on a continuous film of the first metal, which is disposed on the substrate itself. The dewetted metal-containing islands of the second metal can have an average height of less than about 120 nm, and an average longest lateral cross-sectional dimension of about 70 nm to about 150 nm. The area fraction of the surface of the first metal film on the chemically strengthened (ion exchanged) alkali aluminosilicate glass substrate that is covered by the dewetted metal-containing islands can be less than or equal to about 0.10.

The various embodiments of the present disclosure are further illustrated by the following non-limiting examples.

EXAMPLES

Example 1: Dewetting of Ni and Cu CUTMF Stacks

In this example, CUTMFs consisting of two layer stacks were prepared on flat glass substrates and dewetted under reduced pressure.

The substrates chosen were non-strengthened flat glass sheets having a nominal composition of 69.2 mol % $SiO_2$, 8.5 mol % $Al_2O_3$, 13.9 mol % $Na_2O$, 1.2 mol % $K_2O$, 6.5 mol % MgO, 0.5 mol % CaO, and 0.2 mol % $SnO_2$.

The deposition of the CUTMFs was carried out using the sputtering system (ATC ORION-8-HV, AJA International) and procedures described in European Patent No. 2133921 A1 and European Patent Application No. 09382238.5, which are incorporated herein by reference as if fully set forth below. The as-deposited CUTMFs comprised a layer of Ni, having an average thickness of about 1 nm, disposed on one surface of the glass samples, and a layer of Cu, having an average thickness of about 6 nm deposited thereon.

After the CUTMFs were formed, the samples were thermally treated in a vacuum furnace (Thermo Scientific, VT 6060 P-500). This involved loading the samples into the furnace at room temperature, followed by first purging the furnace with Ar and then pumping down on the furnace until the pressure was reduced to about 0.01 mbar. At this pressure, the samples were heated to about 250° C. at a rate of about 8° C. to about 9° C. per minute. The samples were held at about 250° C. for about 10 minutes, and subsequently allowed to cool to room temperature. At this point, the pressure in the furnace was returned to ambient pressure, and the samples were removed from the furnace.

Figure 2B:
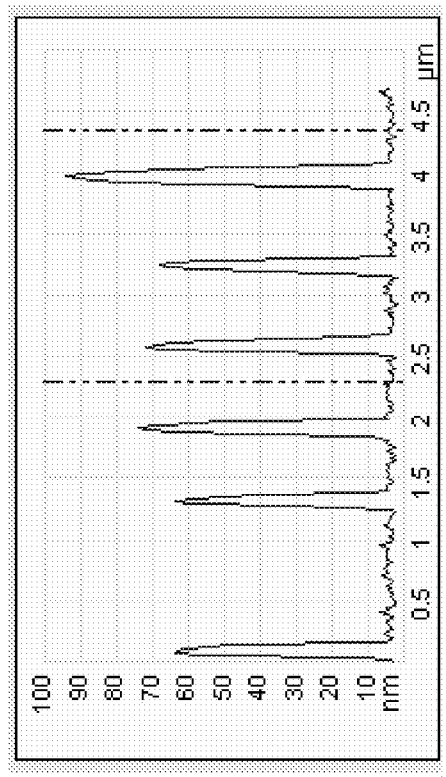
FIG. 2b is a graphical representation of the height profile for a given line across the sample shown in the AFM image of FIG. 2a in accordance with EXAMPLE 1.
Figure 2A:
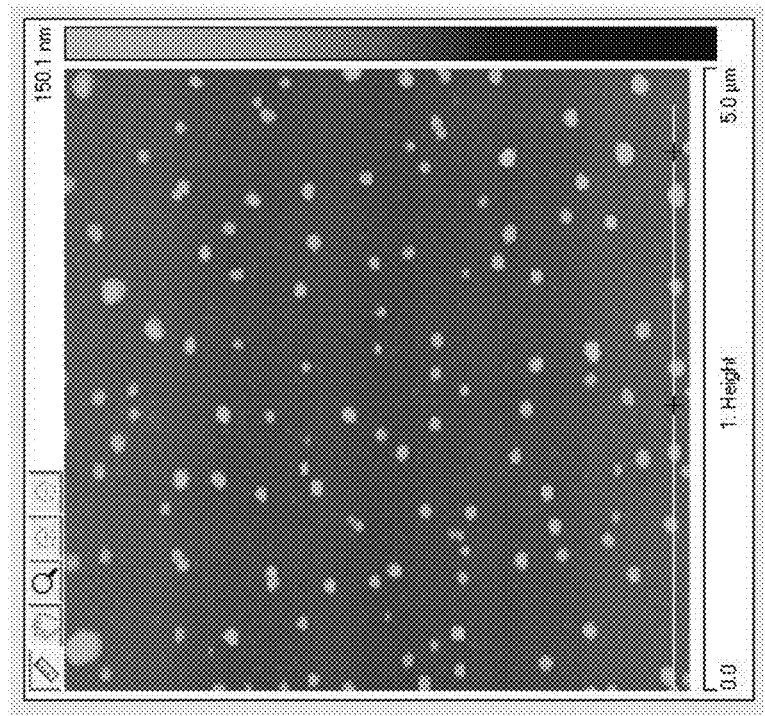
FIG. 2a is an atomic force microscope (AFM) image of a region of a surface of a dewetted sample in accordance with EXAMPLE 1.

FIG. 2a provides an AFM image of a region (having a size of about 5 micrometers by about 5 micrometers) of a surface of a representative sample dewetted in accordance with this example. As can be seen from the AFM image of FIG. 2a, the individual dewetted metal-containing islands in the sample window shown were all less than or equal to about 150 nm in height. In addition, the height profile for the line shown at the bottom of the AFM image of FIG. 2a is provided in FIG. 2b. As can be seen in the graph of FIG. 2b, the height of the islands along this line ranged from about 60 nm to about 95 nm, with an average height of about 70 nm to about 75 nm.

Figure 3:
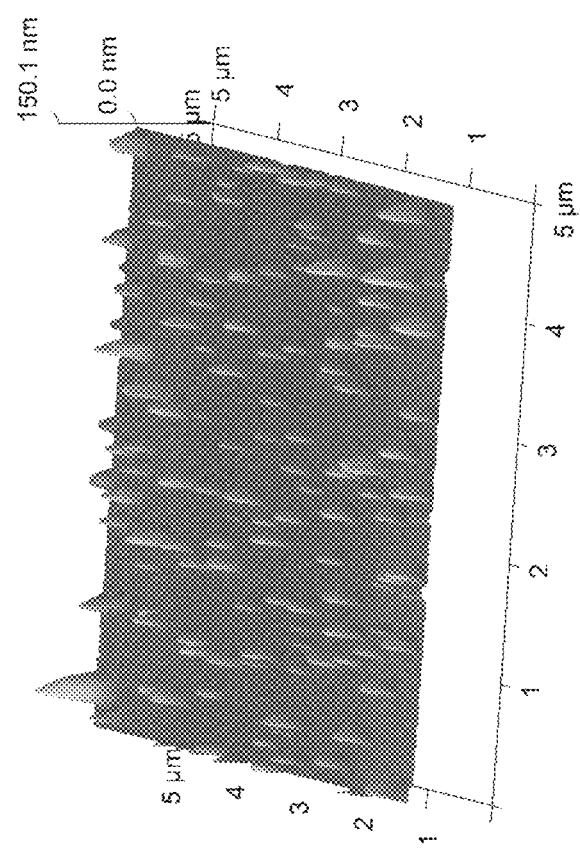
FIG. 3 is a three-dimensional AFM image of the region of the surface of the dewetted sample shown in FIG. 2a in accordance with EXAMPLE 1.

Similarly, FIG. 3 provides another AFM image of the same region of the surface of the sample. As can be seen from the AFM image of FIG. 3, the height distribution for the dewetted metal-containing islands was quite large. There was over a 100 nm window between the shortest and tallest metal-containing islands.

Figure 4:
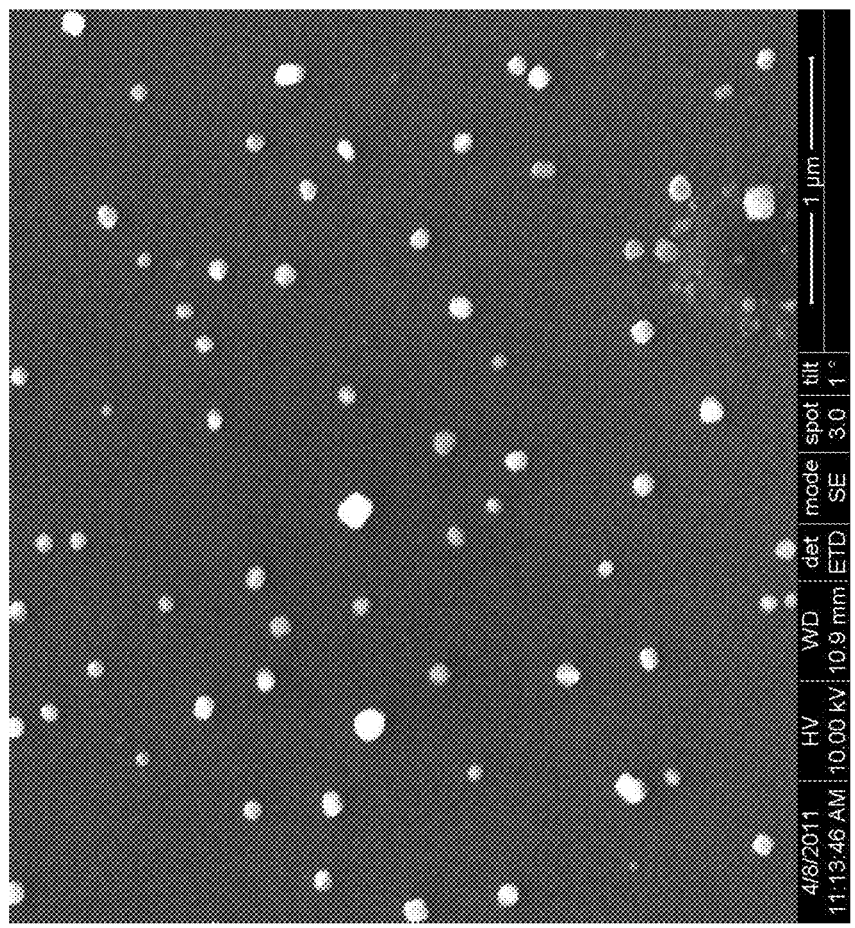
FIG. 4 is a scanning electron microscope (SEM) image of a region of a surface of a dewetted sample in accordance with EXAMPLE 1.

FIG. 4 provides an SEM image of a region of a surface of a representative sample dewetted in accordance with this example. SEM analysis was able to provide general information regarding the lateral cross-section of the dewetted metal-containing islands. As can be seen in the SEM image of FIG. 4, the individual dewetted metal-containing islands in the sample window shown had a lateral cross-section of less than or equal to about 150 nm.

Example 2: Dewetting of Single Layer Cu CUTMFs

In this example, CUTMFs, which were single layers of Cu, were prepared on glass substrates and dewetted under reduced pressure conditions.

The substrates chosen were about 1 inch by about 1 inch squares of fused silica glass.

The deposition of the CUTMFs was carried out using the sputtering system (ATC ORION-8-HV, AJA International) and procedures described in European Patent No. 2133921 A1 and European Patent Application No. 09382238.5, which are incorporated herein by reference as if fully set forth below. The as-deposited Cu films had an average thickness of about 5 nm.

After the CUTMFs were formed, each sample was independently maintained in the sample holder of the sputtering system for the dewetting step. The samples were heated to about 450° C., at a rate of about 64° C. per minute. The samples were held at about 450° C. for about 20 minutes while $N_2$ was flowing in the sample chamber at a rate of about 20 standard cubic centimeters per minute (sccm). The samples were subsequently allowed to cool to about 50° C., at which point they were removed from the sample chamber. During the thermal treatment, the pressure in the sample chamber was about $0.6 \times 10^{-3}$ Torr.

Figure 5:
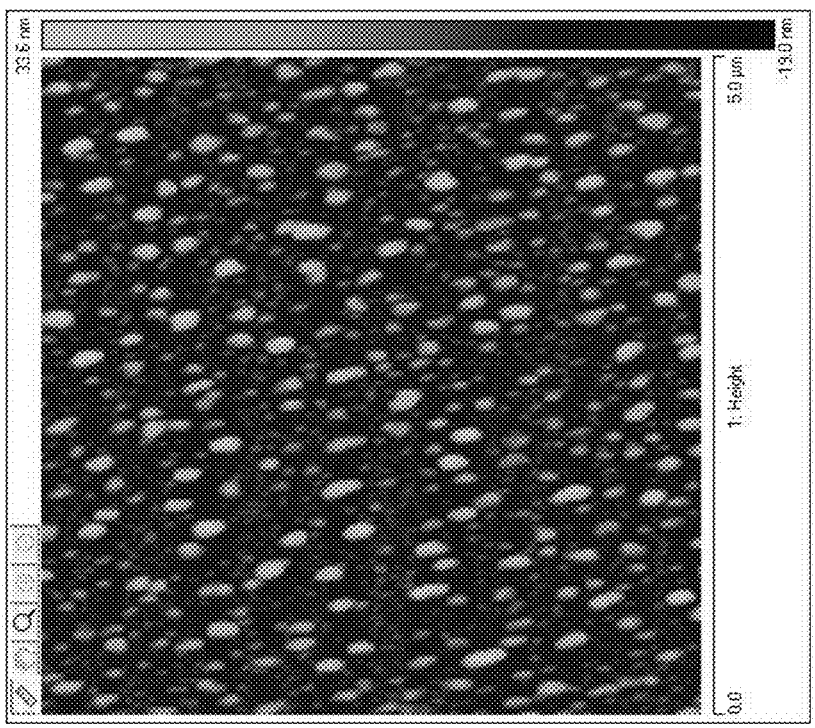
FIG. 5 is an AFM image of a region of a surface of a dewetted sample in accordance with EXAMPLE 2.

FIG. 5 provides an AFM image of a region (having a size of about 5 micrometers by about 5 micrometers) of a surface of a representative sample dewetted in accordance with this example. As can be seen from the AFM image of FIG. 5, the individual dewetted metal-containing islands in the sample window shown were all less than or equal to about 34 nm in height.

Example 3: Dewetting of Single Layer Cu CUTMFs

In this example, CUTMFs, which were single layers of Cu, were prepared on glass substrates and dewetted under ambient pressure conditions.

The substrates chosen were about 2 inch by about 2 inch squares of non-strengthened flat glass sheets having a nominal composition of 69.2 mol % $SiO_2$, 8.5 mol % $Al_2O_3$, 13.9 mol % $Na_2O$, 1.2 mol % $K_2O$, 6.5 mol % MgO, 0.5 mol % CaO, and 0.2 mol % $SnO_2$.

The deposition of the CUTMFs was carried out using an in-line DC magnetron sputtering system (KDF903i, KDF Electronics) and using the procedures described in European Patent No. 2133921 A1 and European Patent Application No. 09382238.5, which are incorporated herein by reference as if fully set forth below. Each glass substrate was cleaned prior to film deposition. During each deposition step, 12 substrate pieces were placed on a 12 inch by 12 inch carrier pallet. The as-deposited Cu films had an average thickness of about 6 nm.

After deposition, the adhesion of the CUTMFs was characterized in accordance with the so-called "adhesive tape test," defined in ASTM D3359-97, which is incorporated herein by reference as if fully set forth below. Each sample passed the adhesive tape test.

Each sample was then transferred to a rapid thermal annealing (RTA) furnace for dewetting. This involved loading the samples into the RTA furnace at room temperature, followed by first purging the furnace chamber with dry $N_2$ to eliminate the presence of $O_2$. Each sample was then heated in the $N_2$ atmosphere under ambient pressure to about 750° C. within about 30 seconds to about 60 seconds. The samples were held at about 750° C. for about 50 seconds to about 125 seconds, and subsequently allowed to cool to below about 150° C. At this point, the samples were removed from the RTA furnace.

Figure 6:
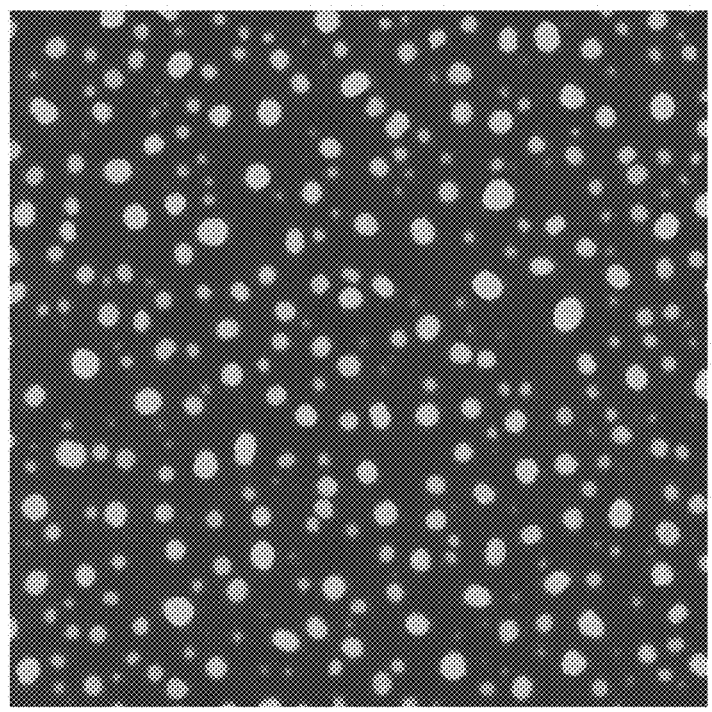
FIG. 6 is an AFM image of a region of a surface of a dewetted sample in accordance with EXAMPLE 3.

FIG. 6 provides an AFM image of a region (having a size of about 5 micrometers by about 5 micrometers) of a surface of a representative sample dewetted in accordance with this example.

Example 4: Dewetting of Single Layer Cu CUTMFs

In this example, CUTMFs, which were single layers of Cu, were prepared on glass substrates and dewetted under reduced pressure conditions.

The substrates chosen were about 2 inch by about 2 inch squares of non-strengthened flat glass sheets having a nominal composition of 69.2 mol % $SiO_2$, 8.5 mol % $Al_2O_3$, 13.9 mol % $Na_2O$, 1.2 mol % $K_2O$, 6.5 mol % MgO, 0.5 mol % CaO, and 0.2 mol % $SnO_2$.

The deposition of the CUTMFs was carried out using an in-line DC magnetron sputtering system (KDF903i, KDF Electronics) and using the procedures described in European Patent No. 2133921 A1 and European Patent Application No. 09382238.5, which are incorporated herein by reference as if fully set forth below. Each glass substrate was cleaned prior to film deposition. During each deposition step, 12 substrate pieces were placed on a 12 inch by 12 inch carrier pallet. The as-deposited Cu films had an average thickness of about 6 nm.

After deposition, the adhesion of the CUTMFs was characterized in accordance with the so-called "adhesive tape test," defined in ASTM D3359-97, which is incorporated herein by reference as if fully set forth below. Each sample passed the adhesive tape test.

The samples were then thermally treated in a vacuum furnace (Thermo Scientific, VT 6060 P-500). This involved loading the samples into the furnace at room temperature, followed by first purging the furnace with P10 gas (90% Ar and 10% $CH_4$) and then pumping down on the furnace until the pressure was reduced to about 4 mTorr. At this pressure, the samples were heated to about 450° C. at a rate of about 30° C. per minute. The samples were held at about 450° C. for about 5 minutes, and subsequently allowed to cool to room temperature. At this point, the pressure in the furnace was returned to ambient pressure, and the samples were removed from the furnace.

Figure 7:
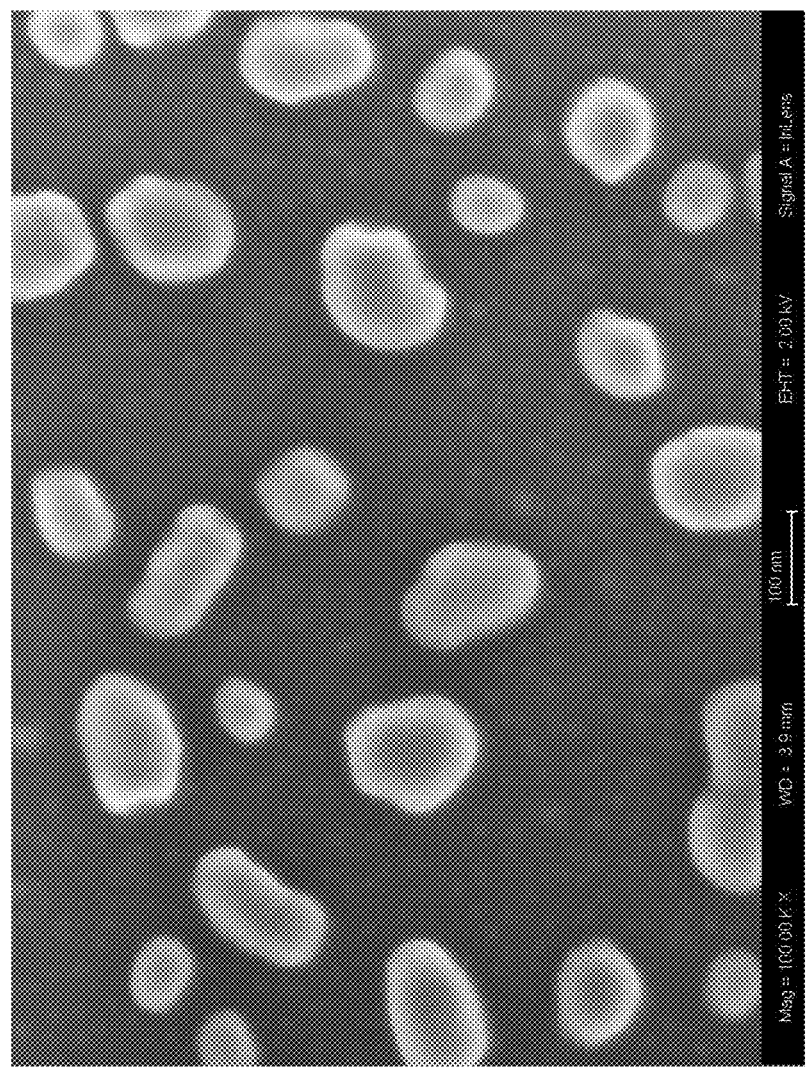
FIG. 7 is an SEM image of a region of a surface of a dewetted sample in accordance with EXAMPLE 4.

FIG. 7 provides an SEM image of a region (having a size of about 5 micrometers by about 5 micrometers) of a surface of a representative sample dewetted in accordance with this example. As can be seen in the SEM image of FIG. 7, the individual dewetted metal-containing islands in the sample window shown had a lateral cross-section of less than or equal to about 200 nm.

Example 5: Dewetting of Single Layer Ni, Cu, or Ag CUTMFs

In this example, CUTMFs, which were single layers of Ni, Cu or Ag, were prepared on glass substrates and dewetted under ambient pressure conditions.

The substrates chosen were about 1 inch by about 1 inch squares of fused silica glass.

The deposition of the CUTMFs was carried out using an in-line DC magnetron sputtering system (KDF903i, KDF Electronics) and using the procedures described in European Patent No. 2133921 A1 and European Patent Application No. 09382238.5, which are incorporated herein by reference as if fully set forth below. Each glass substrate was cleaned prior to film deposition. During each deposition step, 12 substrate pieces were placed on a 12 inch by 12 inch carrier pallet. The as-deposited metal films had an average thickness of about 15 nm.

After deposition, each sample was then transferred to a rapid thermal annealing (RTA) furnace for dewetting. This involved loading the samples into the RTA furnace at room temperature, followed by first purging the furnace chamber with dry $N_2$ to eliminate the presence of $O_2$. Each sample was then heated in the $N_2$ atmosphere under ambient pressure to about 750° C. within about 30 seconds to about 60 seconds. The samples were held at about 750° C. for about 55 seconds, and subsequently allowed to cool to below about 150° C. At this point, the samples were removed from the RTA furnace.

Figure 8B:
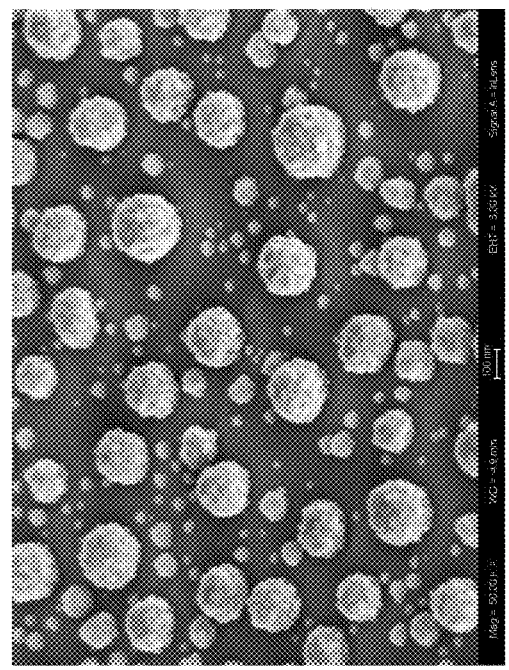
FIG. 8b is an SEM image of a region of a surface of a dewetted sample in accordance with EXAMPLE 5.
Figure 8A:
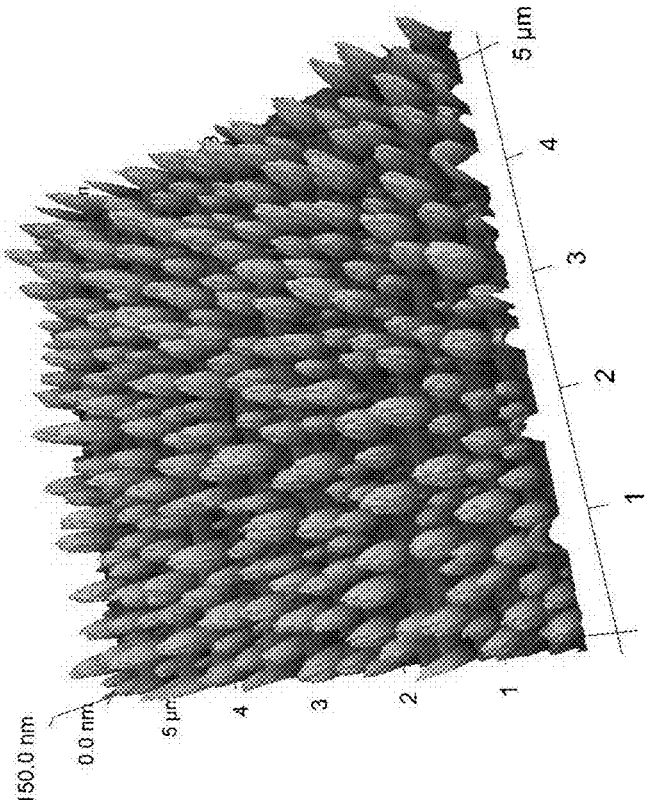
FIG. 8a is a three-dimensional AFM image of a region of a surface of a dewetted sample in accordance with EXAMPLE 5.

FIG. 8a provides an AFM image of a region (having a size of about 5 micrometers by about 5 micrometers) of a surface of a representative sample of a Cu CUTMF dewetted in accordance with this example. As can be seen from the AFM image of FIG. 8a, the individual dewetted Cu-containing islands in the sample window shown were all less than or equal to about 150 nm in height.

FIG. 8b provides an SEM image of a region of a surface of a representative sample of a Cu CUTMF dewetted in accordance with this example. As can be seen in the SEM image of FIG. 8b, the individual dewetted Cu-containing islands in the sample window shown had a lateral cross-section of less than or equal to about 200 nm.

Figure 9:
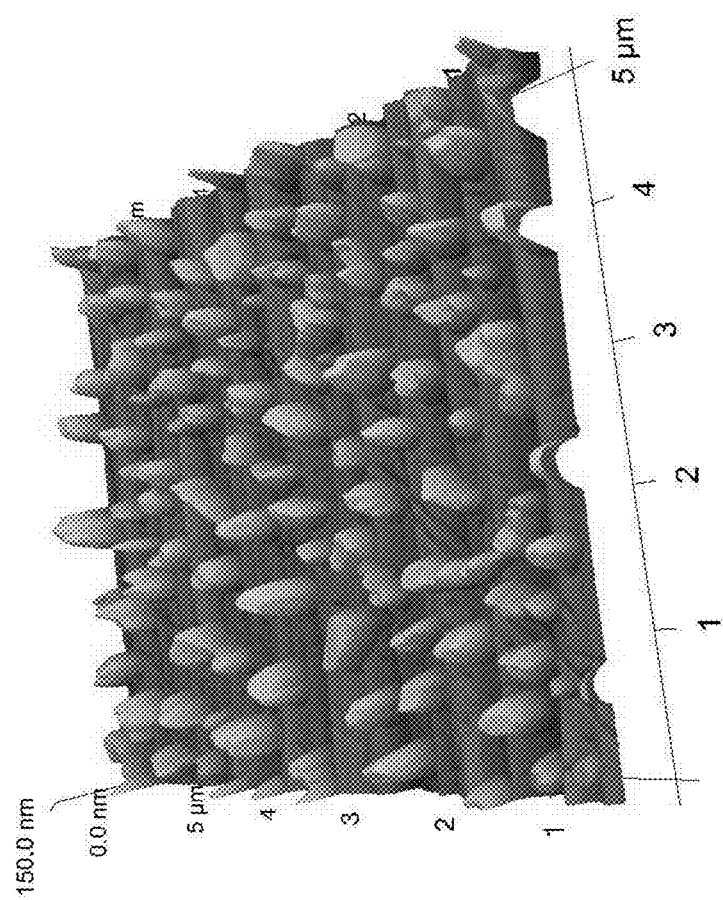
FIG. 9 is a three-dimensional AFM image of a region of a surface of a dewetted sample in accordance with EXAMPLE 5.

FIG. 9 provides an AFM image of a region (having a size of about 5 micrometers by about 5 micrometers) of a surface of a representative sample of a Ni CUTMF dewetted in accordance with this example. As can be seen from the AFM image of FIG. 9, the individual dewetted Ni-containing islands in the sample window shown were all less than or equal to about 150 nm in height.

Figure 10B:
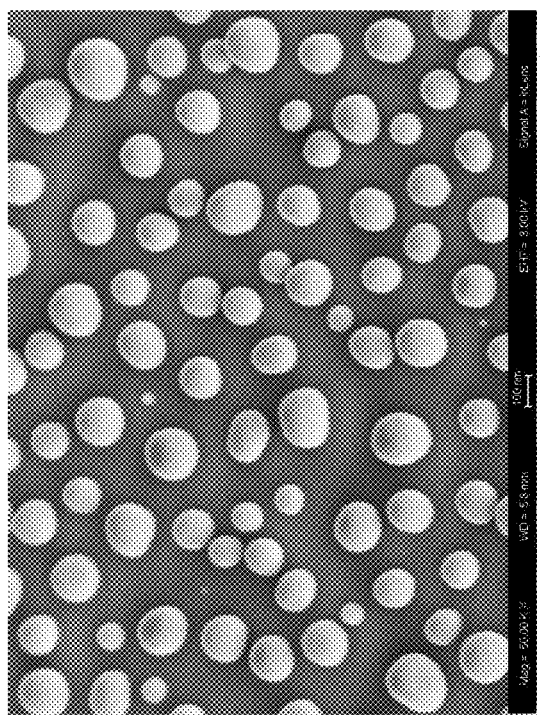
FIG. 10b is an SEM image of a region of a surface of a dewetted sample in accordance with EXAMPLE 5.
Figure 10A:
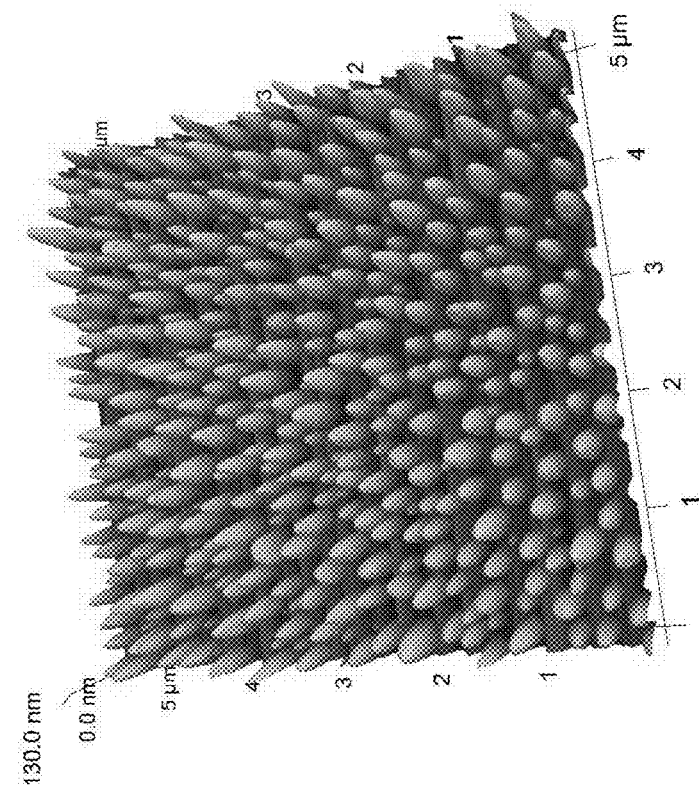
FIG. 10a is a three-dimensional AFM image of a region of a surface of a dewetted sample in accordance with EXAMPLE 5.

FIG. 10a provides an AFM image of a region (having a size of about 5 micrometers by about 5 micrometers) of a surface of a representative sample of a Ag CUTMF dewetted in accordance with this example. As can be seen from the AFM image of FIG. 10a, the individual dewetted Ag-containing islands in the sample window shown were all less than or equal to about 130 nm in height.

FIG. 10b provides an SEM image of a region of a surface of a representative sample of a Ag CUTMF dewetted in accordance with this example. As can be seen in the SEM image of FIG. 10b, the individual dewetted Ag-containing islands in the sample window shown had a lateral cross-section of less than or equal to about 200 nm.

Example 6: Dewetting of Single Layer Cu CUTMFs

In this example, the effects of dewetting time were studied on CUTMFs, which were single layers of Cu, were prepared on glass substrates, and were dewetted under ambient pressure conditions.

The same procedure as described in EXAMPLE 3 above was carried out, with the exception that the as-deposited Cu films had an average thickness of about 10 nm.

Figure 11:
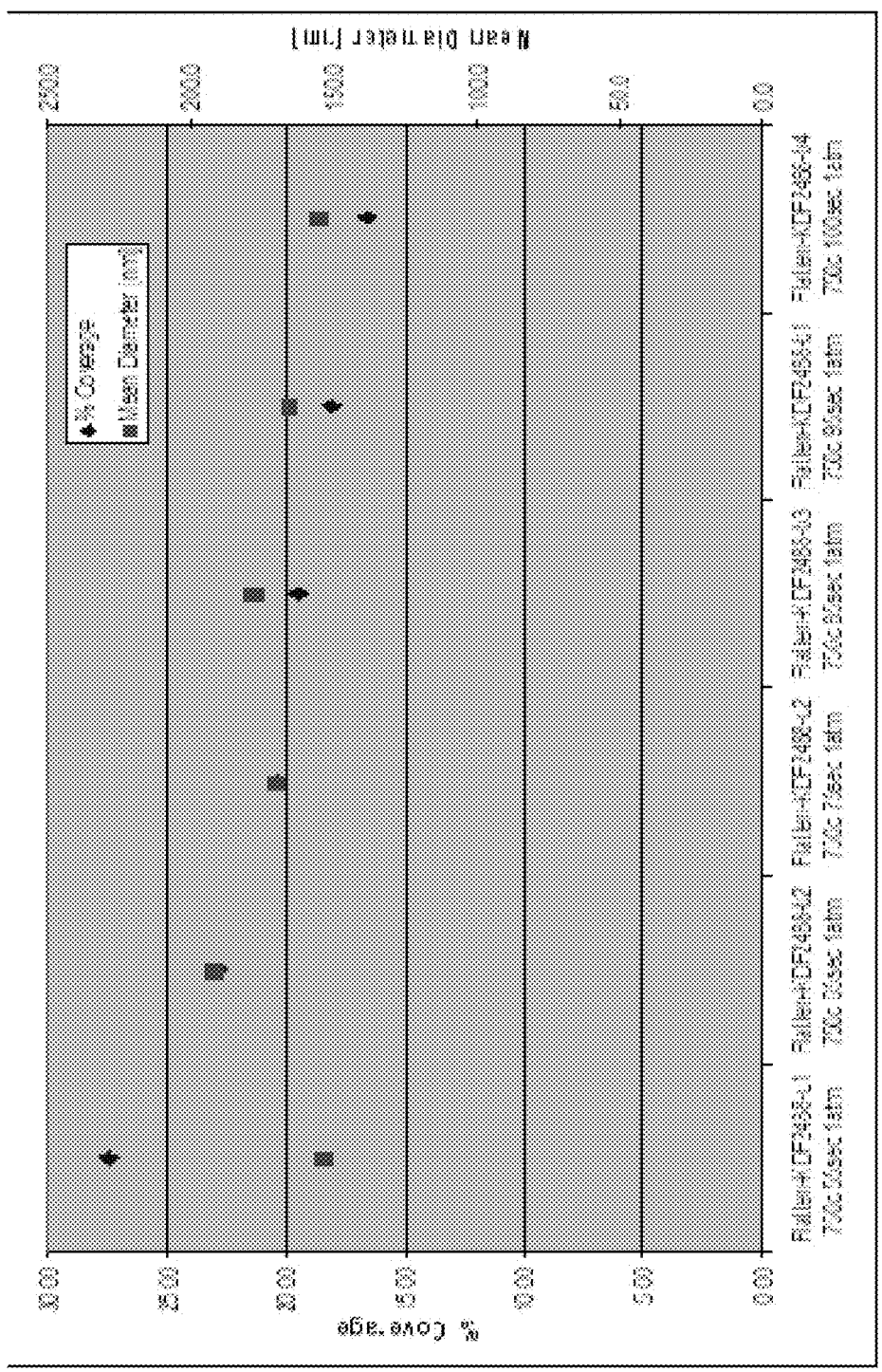
FIG. 11 is a graphical illustration of the average longest lateral cross-section and percent of surface covered by dewetted metal-containing islands as a function of dewetting time in accordance with EXAMPLE 6.

FIG. 11 graphically illustrates the average longest lateral cross-section and percent of surface covered by the dewetted Cu-containing islands as a function of dewetting time. FIG. 11 illustrates the data for dewetting times between about 55 seconds and about 100 seconds. As can be seen from the graph of FIG. 11, the area (expressed as a percentage) of the surface of the substrate that was covered by the dewetted Cu-containing islands is less than or equal to about 27.5% after about 55 seconds of dewetting at about 750° C. in the RTA furnace. This amount was reduced, substantially linearly, to about 17% after about 100 seconds of dewetting at about 750° C. in the RTA furnace. Similarly, the average longest lateral cross-section of the Cu-containing islands varied non-linearly with dewetting time between 150 nm and about 200 nm.

While the embodiments disclosed herein have been set forth for the purpose of illustration, the foregoing description should not be deemed to be a limitation on the scope of the disclosure or the appended claims. Accordingly, various modifications, adaptations, and alternatives may occur to one skilled in the art without departing from the spirit and scope of the present disclosure or the appended claims.

What is claimed is:

1. A method of forming a patterned article, the method comprising:
   providing a substrate comprising a continuous ultra-thin metal-containing film stack disposed on a surface of the substrate, wherein the continuous ultra-thin metal-containing film stack comprises at least a first layer disposed on the surface of the substrate and a second layer disposed on the first layer; and
   dewetting at least a portion of the second layer of the continuous ultra-thin metal-containing film stack to produce a plurality of discrete metal-containing dewetted islands on a surface of the first layer of the continuous ultra-thin metal-containing film stack, wherein the dewetting comprises a thermal treatment for a time and at a temperature sufficient to produce the plurality of discrete metal-containing dewetted islands on the surface of the first layer of the continuous ultra-thin metal-containing film stack such that the plurality of discrete metal-containing dewetted islands have an average height of 5 nanometers to 300 nanometers, an average longest lateral cross-sectional dimension of 10 nanometers to 1000 nanometers, and are randomly oriented on the surface of the first layer of the continuous ultra-thin metal-containing film stack so as to cover less than or equal to 0.5 of an area fraction of the surface of the first layer of the continuous ultra-thin metal-containing film stack.

2. The method of forming a patterned article of claim 1, wherein the continuous ultra-thin metal-containing film stack has an average thickness of less than or equal to 10 nanometers.

3. The method of forming a patterned article of claim 1, wherein the continuous ultra-thin metal-containing film stack comprises no openings or void spaces in an area defined by its perimeter.

4. The method of forming a patterned article of claim 1, wherein the continuous ultra-thin metal-containing film stack comprises a metal in its elemental form or a metal that is a constituent of an alloy.

5. The method of forming a patterned article of claim 1, wherein the continuous ultra-thin metal-containing film stack comprises a passivation layer.

6. The method of forming a patterned article of claim 1, wherein the thermal treatment is carried out at a temperature of less than or equal to 800 degrees Celsius.

7. The method of forming a patterned article of claim 1, wherein the thermal treatment is carried out for a time of less than or equal to 1 hour.

8. The method of forming a patterned article of claim 1, wherein the substrate comprises a silicate glass, borosilicate glass, aluminosilicate glass, or boroaluminosilicate glass.

9. The method of forming a patterned article of claim 1, wherein the substrate comprises a glass-ceramic.

10. The method of forming a patterned article of claim 9, wherein the glass-ceramic comprises a ceramic phase, wherein the ceramic phase comprises β-spodumene, β-quartz, nepheline, kalsilite, or carnegieite.

11. The method of forming a patterned article of claim 1, wherein the substrate comprises a ceramic material or a polymer.

12. The method of forming a patterned article of claim 1, wherein the substrate has an average thickness in the range from 0.02 millimeters (mm) to 2 mm.

13. A method of forming a patterned article, the method comprising:
dewetting at least a portion of a second layer of a continuous ultra-thin metal-containing film stack to produce a plurality of discrete metal-containing dewetted islands on a surface of a first layer of the continuous ultra-thin metal-containing film stack,
wherein the continuous ultra-thin metal-containing film stack is disposed on a surface of a substrate, the first layer is disposed on a surface of the substrate and the second layer is disposed on the first layer, and
wherein the plurality of discrete metal-containing dewetted islands have an average height of 5 nanometers to 300 nanometers, an average longest lateral cross-sectional dimension of 10 nanometers to 1000 nanometers, and are randomly oriented on the surface of the first layer of the continuous ultra-thin metal-containing film stack so as to cover less than or equal to 0.5 of an area fraction of the surface of the first layer of the continuous ultra-thin metal-containing film stack.

14. The method of forming a patterned article of claim 13, wherein the dewetting comprises a thermal treatment.

15. The method of forming a patterned article of claim 14, wherein the thermal treatment is carried out at a temperature of less than or equal to 800 degrees Celsius.

16. The method of forming a patterned article of claim 14, wherein the thermal treatment is carried out for a time of less than or equal to 1 hour.

17. The method of forming a patterned article of claim 13, wherein the continuous ultra-thin metal-containing film stack has an average thickness of less than or equal to 10 nanometers.

18. The method of forming a patterned article of claim 13, wherein the continuous ultra-thin metal-containing film stack comprises no openings or void spaces in an area defined by its perimeter.

19. The method of forming a patterned article of claim 13, wherein the continuous ultra-thin metal-containing film stack comprises a metal in its elemental form or a metal that is a constituent of an alloy.

20. The method of forming a patterned article of claim 13, wherein the continuous ultra-thin metal-containing film stack comprises a passivation layer.

\* \* \* \* \*

UNITED STATES PATENT AND TRADEMARK OFFICE
CERTIFICATE OF CORRECTION

PATENT NO. : 10,155,248 B2
APPLICATION NO. : 15/044330
DATED : December 18, 2018
INVENTOR(S) : David Eugene Baker et al.

Page 1 of 1

It is certified that error appears in the above-identified patent and that said Letters Patent is hereby corrected as shown below:

On the Title Page

On page 2, Column 2, item (56), other publications, Line 2, delete "Supression" and insert
-- Suppression --, therefor.

On page 2, Column 2, item (56), other publications, Line 7, delete "lattic-matched" and insert
-- lattice-matched --, therefor.

On page 2, Column 2, item (56), other publications, Line 7, delete "substate." and insert
-- substrate. --, therefor.

On page 2, Column 2, item (56), other publications, Lines 15-16, delete "Instablility." and insert
-- Instability. --, therefor.

Signed and Sealed this
Thirteenth Day of October, 2020

Andrei Iancu
*Director of the United States Patent and Trademark Office*